United States Patent [19]

Chiang

[11] Patent Number: 5,506,518
[45] Date of Patent: Apr. 9, 1996

[54] ANTIFUSE-BASED PROGRAMMABLE LOGIC CIRCUIT

[75] Inventor: David Chiang, Saratoga, Calif.

[73] Assignee: Xilinx, Inc., San Jose, Calif.

[21] Appl. No.: 310,114

[22] Filed: Sep. 20, 1994

[51] Int. Cl.$^6$ ............................................. H03K 19/177
[52] U.S. Cl. ............................................. 326/41; 326/106
[58] Field of Search ............................... 326/38, 41, 44, 326/106, 108

[56] References Cited

U.S. PATENT DOCUMENTS

| | | | |
|---|---|---|---|
| 4,641,286 | 2/1987 | Shimotori et al. | 326/106 X |
| 5,039,885 | 8/1991 | Goetting et al. | 326/41 X |
| 5,075,576 | 12/1991 | Cavlan | 326/38 X |
| 5,166,556 | 11/1992 | Hsu et al. | 326/38 X |
| 5,262,994 | 11/1993 | McClure | 326/106 X |

*Primary Examiner*—David R. Hudspeth
*Attorney, Agent, or Firm*—Jeanette S. Harms

[57] ABSTRACT

The present invention provides a programmable logic circuit including a first set of lines coupled to a logic module, a second set of lines, and a plurality of transistors. Each transistor in the array has a first terminal, a second terminal, and a third terminal, wherein the first terminal is coupled to one of the first set of lines and the second terminal is coupled to one of the second set of lines. In accordance with the present invention, an antifuse is coupled between the third terminal of the transistor and a voltage source. By selectively programming antifuses in the array and selectively turning on transistors, complex user functions with a large number of inputs are implemented in one pass.

10 Claims, 4 Drawing Sheets

5,506,518

ANTIFUSE-BASED PROGRAMMABLE LOGIC CIRCUIT

BACKGROUND OF THE INVENTION

1. Field of the Invention

The present invention relates to programmable logic circuits, and in particular to an antifuse-based programmable logic circuit providing a wide fanin functionality.

2. Description of the Related Art

Antifuses are well-known in the art of integrated circuits. An antifuse is a structure which is non-conductive when manufactured, but becomes permanently conductive by applying a predetermined voltage across its terminals. Antifuses are typically used with a programmable logic device (PLD) to selectively interconnect conductive lines. For example, FIG. 1 illustrates a PLD 100 which includes a logic module 101 having twelve input lines, i.e. lines $104_1-104_6$ and lines $105_1-105_6$, and one output line 106. Lines $104_1-104_6$ and lines $105_1-105_6$ are connected to lines $102_1-102_N$ and lines $103_1-103_N$, respectively, by programing antifuses 107.

Thus, this configuration limits fanin to the number of input lines (in this example twelve input lines). Hence, user applications requiring wider fanin require multiple passes of logic modules, thereby slowing performance. Therefore, a need arises for a PLD having a wide fanin functionality.

SUMMARY OF THE INVENTION

In accordance with the present invention, a programmable logic circuit includes a first set of lines coupled to a logic module, a second set of lines, and a plurality of transistors. Each transistor has a first terminal, a second terminal, and a third terminal, wherein the first terminal is coupled to one of the first set of lines and the second terminal is coupled to one of the second set of lines. The circuit of the present invention further includes a plurality of antifuses, wherein each antifuse is coupled between the third terminal of one of the transistors and a voltage source.

In another embodiment, the second terminal of each transistor is coupled to one of the second set of lines and the third terminal is coupled to a voltage source. In this embodiment, each antifuse is coupled between the first terminal of one of the transistors and one of the first set of lines.

In one embodiment, the transistors are n-type transistors, the first terminal is a drain, the second terminal is a gate, the third terminal is a source, and the voltage source is ground. Thus, a high signal on one of the second set of lines (the word line) turns on the transistors on the word line. The states of the input signals to the logic module on the first set of lines (the bit lines) depend on whether the antifuses associated with the word line are programmed or unprogrammed. Specifically, if an antifuse is programmed, i.e. conducting, the bit line associated with the transistor is pulled low. If, on the other hand, the antifuse is unprogrammed, i.e. non-conducting, the bit line associated with the transistor is floating.

Thus, in accordance with the present invention, by selectively programming antifuses and selectively turning on predetermined transistors, complex user functions with a large number of input signals are implemented in one pass while conserving valuable silicon area.

DETAILED DESCRIPTION OF THE DRAWINGS

Figure 2:
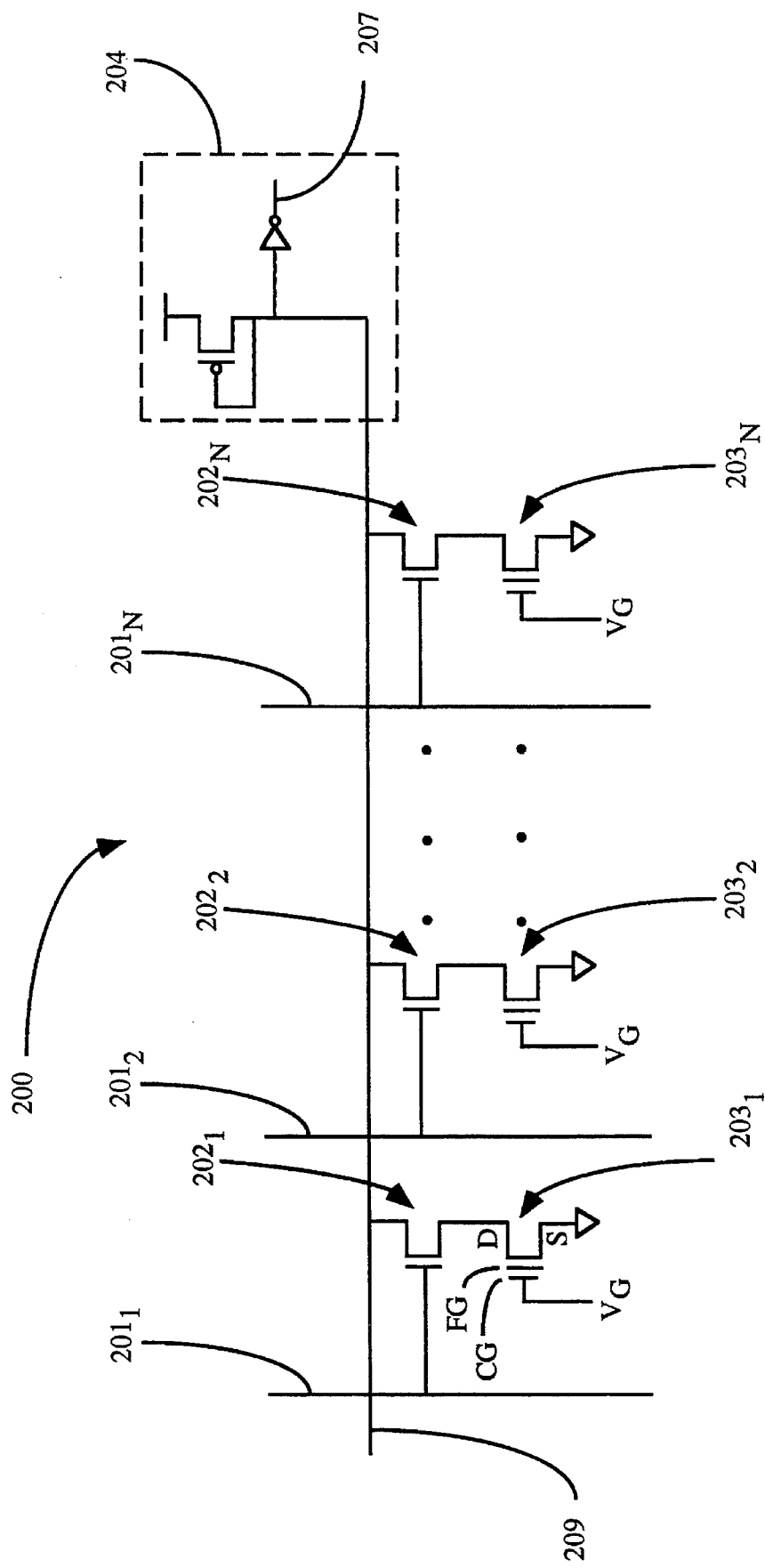
FIG. 2 illustrates a typical EEPROM cell array.

A programmable logic circuit in accordance with the present invention includes a plurality of programmable devices to provide signals to a logic module. In prior art arrays, such as the memory cell array 200 in FIG. 2, the programmable devices are electrically erasable programmable read only memory (EEPROM) cells $203_1-203_N$. An EEPROM cell includes a floating gate FG, a control gate CG, a source S and a drain D (see memory cell $203_1$ for reference). Floating gate FG is isolated from control gate CG by a high impedance insulating material.

To program an EEPROM cell, i.e. to store electrons on its floating gate FG, a high voltage is applied to control gate CG and zero volts is applied to source S and drain D, thereby causing electrons to flow from the channel area through the dielectric layer to floating gate FG (commonly referred to as Fowler-Nordheim tunneling). To erase an EEPROM cell, i.e. to deplete floating gate FG of electrons, zero volts is applied to control gate CG, a high voltage is applied to drain D, and source S is left floating. In this case, electrons from floating gate FG will flow through the dielectric layer to drain D using Fowler-Nordheim tunneling. After the high voltage is removed in the programming operation, the EEPROM exhibits a high threshold voltage, i.e. cannot be turned on using a nominal voltage at control gate CG. In contrast, after the high voltage is removed in the erase operation, the EEPROM exhibits a low threshold voltage.

In array 200, EEPROM cells $203_1-203_N$ are biased with a voltage source $V_G$ of typically 3 volts. Therefore, depending on the unprogrammed or programmed state of EEPROM cells $203_1-203_N$, these cells are either continuously on or off, respectively. An EEPROM cell $203_2$, for example, is read by placing a high voltage on line $201_2$, thereby turning on n-type transistor $202_2$. If EEPROM cell $203_2$ is unprogrammed, it conducts, thereby pulling the signal on line 209 low (i.e. to ground). On the other hand, if EEPROM cell $203_2$ is programmed, it does not conduct. Therefore, line 209 is left floating. An amplifier 204 (described in detail in reference to FIG. 3) senses the voltage on line 209 and ensures a well-defined output signal on line 207. However, although array 200 would provide the logic signals to increase fanin functionality, array 200 is undesirably large due to the size of the individual EEPROM cells 203.

To minimize the use of valuable silicon area, the present invention replaces EEPROM cells 203 with antifuses. Antifuse technology offers significant advantages over EEPROM technology and other technologies for PLDs by providing a basic programming element, i.e. the antifuse itself, having a very small area. For example, an antifuse is typically ⅕ the size of an EEPROM cell using a comparable fabrication process.

Figure 3:
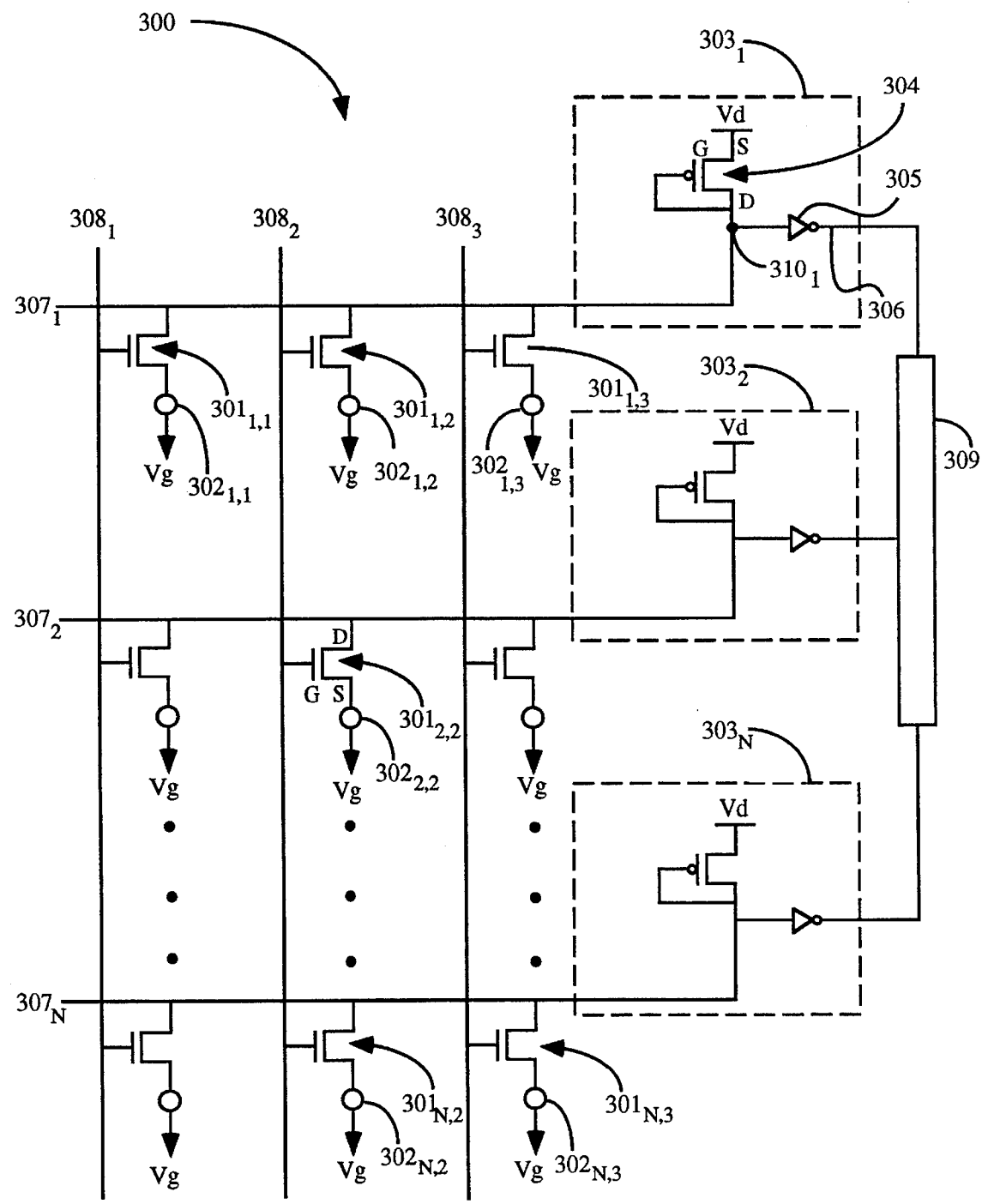
FIG. 3 shows the fanin of a programmable logic device using antifuses in accordance with the present invention.

Referring to FIG. 3, a programmable logic circuit 300 includes a first set of lines $307_1-307_N$ coupled to a logic module 309, a second set of lines $308_1-308_3$, and a plurality of transistors $301_{1,1}-301_{N,3}$. Each transistor in circuit 300, for example transistor $301_{2,2}$ has a first terminal, a second terminal, and a third terminal. The first terminal, a gate G, is coupled to line $308_2$, while the second terminal, a drain D, is coupled to line $307_2$. In accordance with the present invention, an antifuse $302_{2,2}$ is coupled between the third terminal, a source S, of transistor $301_{2,2}$ and a voltage source Vg (ground in one embodiment).

In this embodiment, the plurality of transistors 301 are n-type transistors. Thus, a high signal on line $308_2$ turns on transistors $301_{1,2}$–$301_{N,2}$ and allows the transfer of signals through these transistors. The states of the transferred signals provided to amplifiers $303_1$–$303_N$ depends on whether antifuses $302_{1,2}$–$302_{N,2}$ are programmed or unprogrammed. Specifically, if antifuse $302_{2,2}$, for example, is programmed, i.e. conducting, line $307_2$ is pulled low by voltage source Vg. On the other hand, if antifuse $302_{2,2}$ is unprogrammed, i.e. non-conducting, line $307_2$ is left floating.

Initially, all antifuses 302 in circuit 300 are unprogrammed. An individual antifuse, for example $302_{N,3}$ is selectively programmed by applying a high voltage, i.e. typically 8 volts, on line $308_3$ and a high voltage, i.e. typically 12 volts, on line $307_N$. An antifuse 302 not selected during programming has either its associated line 308 at zero volts, its associated line 307 grounded (or floating), or both.

In this embodiment of the present invention, circuit 300 includes amplifiers $303_1$–$303_N$ coupled to lines $307_1$–$307_N$, respectively. Referring to amplifier $303_1$, the p-type transistor 304 has its source S coupled to voltage source Vd (typically 5 volts) and its gate G coupled to its drain D. In this configuration, assuming line $307_1$ is floating, transistor 304 provides a passive pull-up on node 310. Specifically, transistor 304, which is always conducting, provides a voltage of approximately 4 volts at node 310 in the absence of any active pull-down. This high signal is inverted by inverter $305_1$, thereby providing a strong low signal on line 306. As previously mentioned, if any one of transistors $301_{1,1}$–$301_{1,3}$ is conducting and is coupled to a programmed transistor 302, line $307_1$, and hence node 310, is pulled low by voltage source Vg. This low signal is inverted by inverter $305_1$ thereby providing a high signal on line 306.

Figure 4:
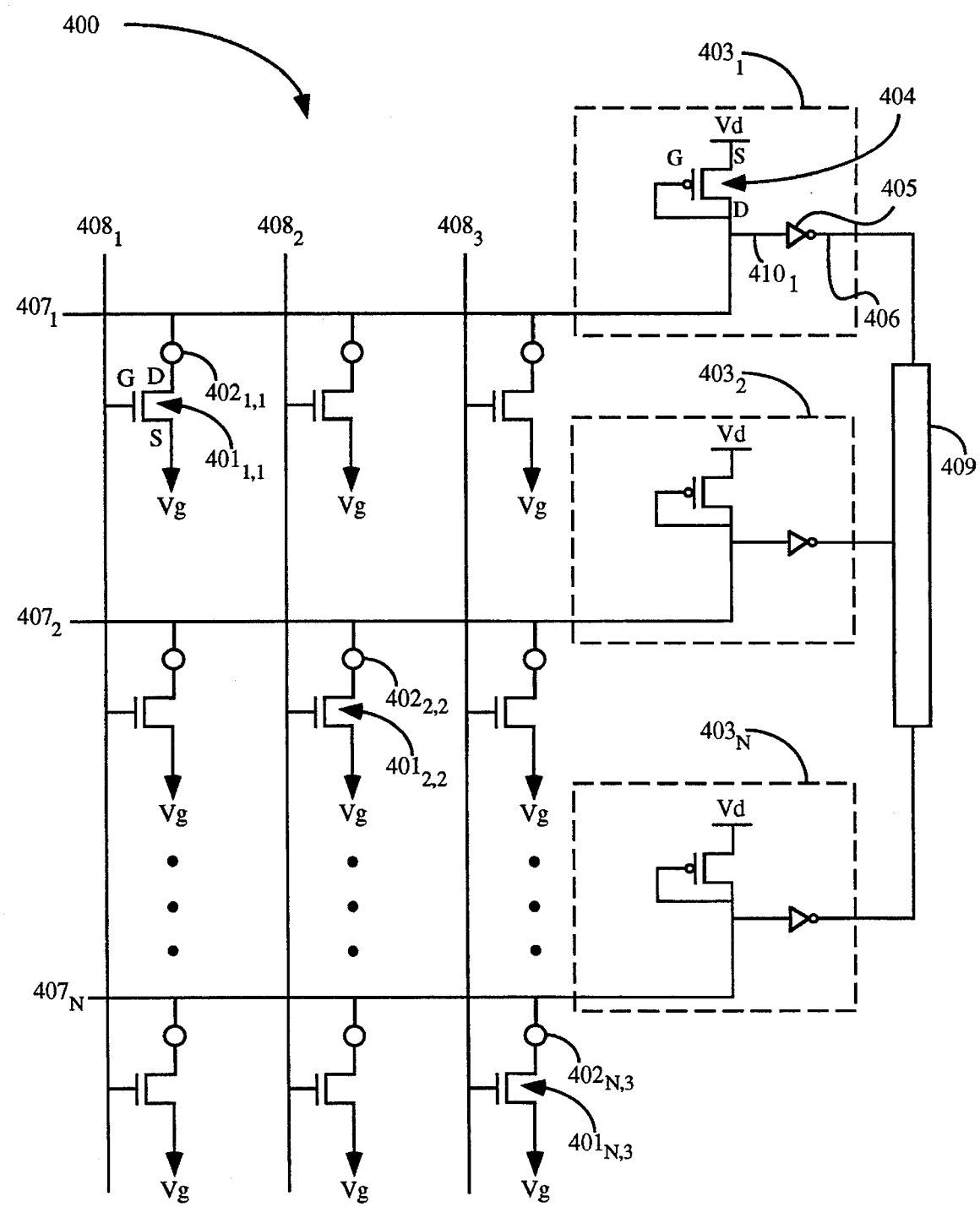
FIG. 4 illustrates another programmable logic device in accordance with the present invention.

In another embodiment of the present invention shown in FIG. 4, the gate G of each transistor 401 is coupled to one of the second set of lines 408 and the source S of each transistor 401 is coupled to the voltage source Vg. Programmable logic device 400 further includes a plurality of antifuses 402, wherein each antifuse 402 is coupled between the drain D of one of the transistors 401 and one of lines 407. Thus, for example, a high signal on line $408_2$ turns on transistors $401_{1,2}$–$401_{N,2}$. The state of the input signals to logic module 409 via lines $407_1$–$407_N$ depends on whether antifuses $402_{1,2}$–$402_{N,2}$ are programmed or unprogrammed. Specifically, if antifuse $402_{N,2}$, for example, is programmed, i.e. conducting, line $407_N$ is pulled low by voltage source Vg. On the other hand, if antifuse $402_{N,2}$ is unprogrammed, i.e. non-conducting, line $407_N$ is left floating. The operation of sense amplifiers $403_1$–$403_N$ is the same as that described above for sense amplifiers $303_1$–$303_N$ (FIG. 3) and therefore is not described in detail.

Figure 1:
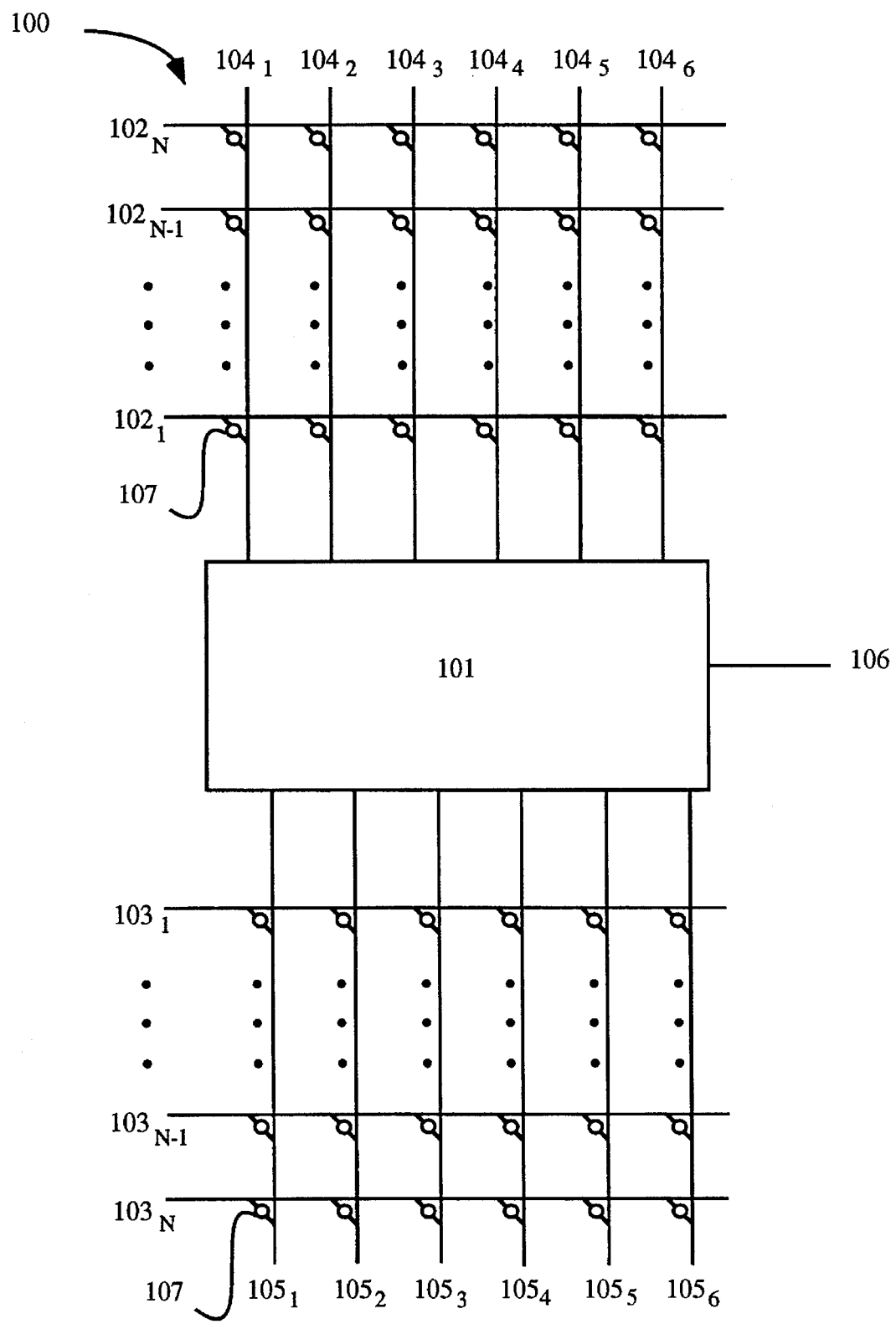
FIG. 1 illustrates a known programmable logic device having a limited fanin.

The present invention provides a number of significant advantages over prior art programmable logic devices. For example, referring back to FIG. 1, PLD 100 can only be a function of the number of input lines 104 and 105. All logic functions are performed by logic module 101.

In accordance with the present invention and referring to FIGS. 3 and 4, the programmable logic circuit 300,400 itself forms logic functions. Specifically, by selectively programming antifuses 302,402 in array 300,400 and selectively turning on transistors 301,401, complex user functions with a large number of input signals are implemented in one pass, thereby dramatically increasing the fanin functionality of the programmable logic device.

The above description of the present invention is meant to be illustrative only and not limiting. For example, in another embodiment, a sense amplifier with virtual ground is used in the array. Other embodiments will be apparent to those skilled in the art in light of the detailed description. The present invention is set forth in the appended claims.

I claim:

1. A programmable logic circuit coupled to a logic module, said logic circuit comprising:

a first set of lines coupled to said logic module;

a second set of lines;

a plurality of transistors, each transistor having a first terminal, a second terminal, and a third terminal, wherein said first terminal is coupled to one of said first set of lines and said second terminal is coupled to one of said second set of lines; and a plurality of antifuses, each antifuse coupled between said third terminal of one of said transistors and a voltage source.

2. The circuit of claim 1 wherein said first terminal of said transistor is a drain.

3. The circuit of claim 2 wherein said second terminal of said transistor is a gate.

4. The circuit of claim 3 wherein said third terminal of said transistor is a source.

5. The circuit of claim 1 wherein said voltage source is ground.

6. The circuit of claim 1 wherein at least one of said antifuses is programmed.

7. The circuit of claim 1 further including a plurality of amplifiers coupled between said first set of lines and said logic module.

8. A method of increasing fanin functionality in a logic circuit comprising the steps of:

coupling a first line to a logic module;

coupling a first terminal of a transistor to said first line;

coupling a second terminal of said transistor to a second line; and coupling an antifuse between a third terminal of said transistor and a voltage source.

9. The method of claim 8 further including the step of programing said antifuse.

10. The method of claim 8 further including the step of coupling an amplifier between said first line and said logic module.

* * * * *